(12) United States Patent  
Fan et al.

(10) Patent No.: US 8,226,796 B2
(45) Date of Patent: Jul. 24, 2012

(54) FLANGED COLLET FOR DIE PICK-UP TOOL

(75) Inventors: Yau Sun Fan, Hong Kong (CN); Wai Shing Ho, Hong Kong (CN); Hiu Leung Tse, Hong Kong (CN); Yee Fan Yeung, Hong Kong (CN); Ka On Yue, Hong Kong (CN)

(73) Assignee: ASM Assembly Automation Ltd, Hong Kong (HK)

( * ) Notice: Subject to any disclaimer, the term of this patent is extended or adjusted under 35 U.S.C. 154(b) by 385 days.

(21) Appl. No.: 12/353,476

(22) Filed: Jan. 14, 2009

(65) Prior Publication Data

US 2010/0175828 A1    Jul. 15, 2010

(51) Int. Cl.
 *B32B 38/10*    (2006.01)
(52) U.S. Cl. ........ 156/707; 156/718; 156/758; 156/763; 156/930

(58) Field of Classification Search ................. 156/344, 156/584, 707, 718, 758, 763, 930
See application file for complete search history.

(56) References Cited

U.S. PATENT DOCUMENTS

| | | | | |
|---|---|---|---|---|
| 4,274,576 A * | 6/1981 | Shariff | ......................... | 228/264 |
| 4,954,453 A * | 9/1990 | Venutolo | ......................... | 29/592 |
| 5,423,931 A * | 6/1995 | Inoue et al. | ..................... | 156/94 |
| 5,425,833 A * | 6/1995 | Fujimoto et al. | ............. | 156/344 |
| 6,156,150 A * | 12/2000 | Nishida | ......................... | 156/344 |
| 6,173,632 B1 * | 1/2001 | Choy | ................................ | 83/13 |

\* cited by examiner

*Primary Examiner* — Mark A Osele
(74) *Attorney, Agent, or Firm* — Ostrolenk Faber LLP

(57) ABSTRACT

A collet is provided for picking up a die mounted on an adhesive surface. A flat platform at an end of the collet is configured to hold a planar surface of the die during pick-up of the die and a flange protruding from one side of the platform is operative to push against a side of the die which is substantially perpendicular to the planar surface of the die during a die pick-up process.

9 Claims, 5 Drawing Sheets

FLANGED COLLET FOR DIE PICK-UP TOOL

FIELD OF THE INVENTION

The present invention relates to pick-and-place tools for electronic devices, and in particular, to die bonders incorporating pick-up collets for picking up electronic devices from surfaces on which they are mounted and then bonding them at another location.

BACKGROUND AND PRIOR ART

Generally, arrays of electronic devices such as semiconductor dice are held securely in position on adhesive surfaces, for instance, after they have been singulated from a sheet of wafer. There are many types of commercially available adhesive surfaces, commonly in the form of adhesive films. However, there are also adhesive surfaces in the form of gel. Gel-Pak® provides an example of a receptacle for dice with an adhesive surface made up of a thin, flexible and adhesive gel membrane. The adhesive gel membrane is supported on a mesh with a non-adhesive side in contact with the mesh. An adhesive side of the gel membrane holds the dice securely. To detach a die from the membrane, vacuum is applied on the non-adhesive side of the gel membrane such that the gel membrane is deformed and conforms to the shape of the mesh. The die is partially detached from the gel membrane as a result of vacuum force on the membrane. Thus, the area of contact between the gel membrane and the die is reduced. The die can usually be removed completely from the gel membrane thereafter by a pick-up tool such as a collet of a die bonder by applying a vacuum suction force on the partially detached die through the collet.

Nevertheless, in cases when the dimensions of a die are as small as 300 µm by 400 µm, the die provides limited area for vacuum suction of the collet to act upon and pick up the die from the adhesive membrane. The problem is worse when the die is placed on very adhesive surface such as that provided by Gel-Pak® if the downward adhesive force on the die is larger than the upward vacuum force on the die from the collet.

Unlike film-based adhesive surfaces, ejector pins cannot be applied on the underside of the film holding the die by pushing the die upwards at specific points on the die, which helps to partially peel the die off from the adhesive surface. Such a method cannot be used when the dice are mounted on adhesives like Gel-Pak® since the space under the die is blocked by a container for the gel. Thus, the only way to remove the firmly-adhered dice may be to manually peel the dice off from the adhesive surface by using a tool such as a pair of tweezers. This manual method of removing dice is both tedious and time consuming when there is a large number of dice to be removed. Therefore, it would be desirable to devise an automated method for detaching dice from adhesive surfaces even where an initial adhesion force is larger than the pick-up force generated by vacuum suction.

SUMMARY OF THE INVENTION

It is thus an object of the invention to seek to provide a collet for detaching very small electronic devices from adhesive surfaces effectively even when the collet's vacuum suction force is not large enough on its own to overcome an initial adhesion force from the adhesive surface on the electronic devices.

According to a first aspect of the invention, there is provided a collet for picking up a die mounted on an adhesive surface, comprising: a flat platform at an end of the collet which is configured to hold a planar surface of the die during pick-up of the die; and a flange protruding from one side of the platform that is operative to push against a side of the die which is substantially perpendicular to the planar surface of the die during a die pick-up process.

According to a second aspect of the invention, there is provided a method for picking up a die mounted on an adhesive surface, comprising the steps of: providing the collet according to the first aspect of the invention; positioning the collet over the die to be picked up; pushing the side of the die with the flange in a first direction such that the die is biased to move in the first direction by the flange; holding the planar surface of the die against the platform; and thereafter picking up the die with the collet along a second direction which is substantially perpendicular to the first direction.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiment of the invention when considered with the accompanying drawings, in which.

DETAILED DESCRIPTION OF THE PREFERRED EMBODIMENT OF THE INVENTION

The preferred embodiment of the present invention will be described hereinafter with reference to the accompanying drawings.

Figure 1:
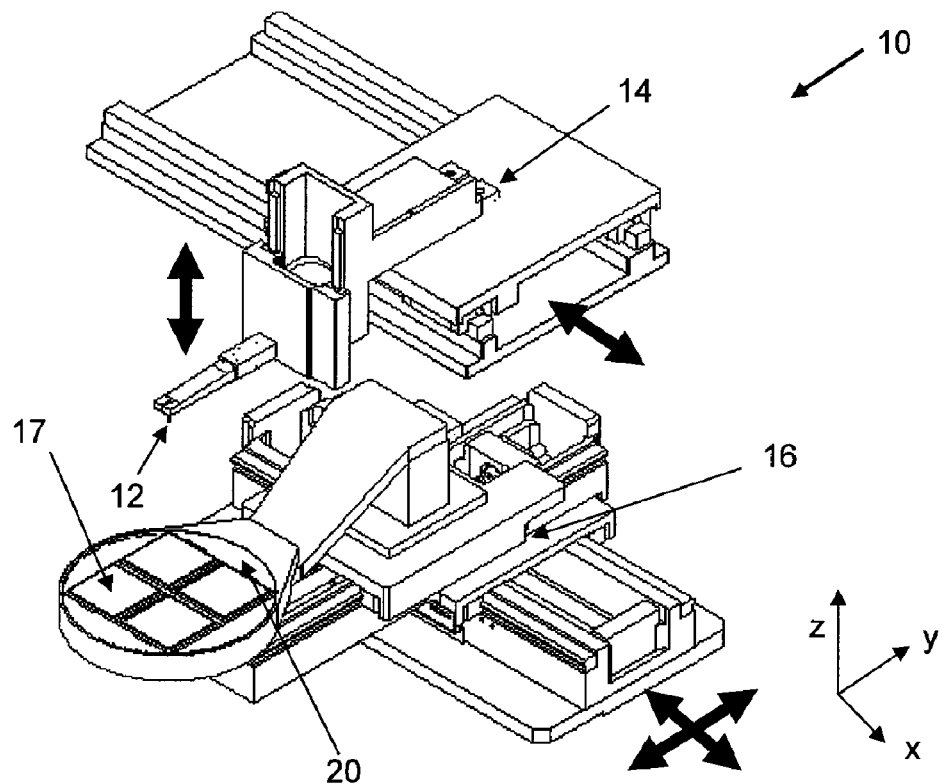
FIG. 1 is an isometric view of a die bonder incorporating a collet according to the preferred embodiment of the invention.

FIG. 1 is an isometric view of a die bonder 10 incorporating a collet 12 according to the preferred embodiment of the invention. The collet 12 is located over a wafer tray 17 containing electronic devices such as semiconductor dice 18, and is movable relative to the wafer tray 17. The collet 12 is mounted to a die pick arm table 14 which is movable in the x and z axes for positioning the collet 12 horizontally and vertically respectively. The wafer tray 17 is mounted to a wafer table 16, which may be positionable in the horizontal x and y axes by an X-Y table. The wafer tray 17 is secured on a ring holder 20. The collet 12 is clamped to the die pick arm table 14 over the wafer tray 17 holding the dice 18 and detaches the dice 18 from the wafer tray 17 by vacuum suction applied through the collet 12.

Figure 2:
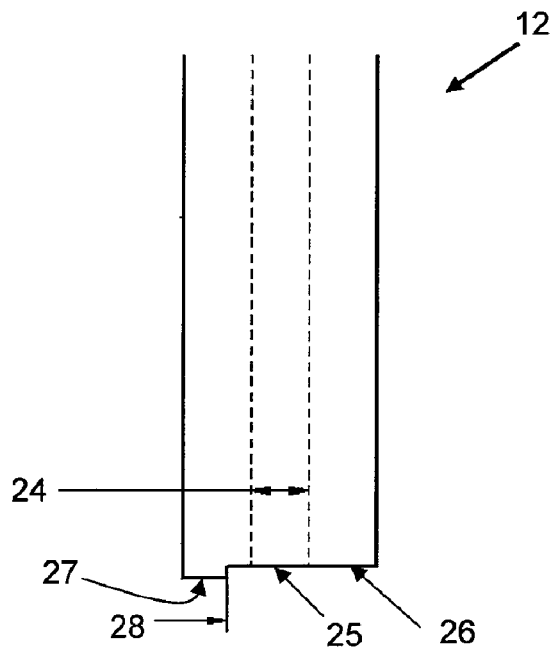
FIG. 2 is a side view of the collet according to the preferred embodiment of the invention.

FIG. 2 is a side view of the collet 12 according to the preferred embodiment of the invention. The collet 12 comprises a vacuum channel 24 extending throughout the length of the collet 12. An end of the collet 12 for picking up a die 18 is cut partially to form a flat platform 26 which has an opening 25 connected to the vacuum channel 24 for applying a vacuum suction force on the die 18 so as to hold a planar surface of the die 18 during pick-up thereof. A flange 27 protrudes orthogonally from one side of the platform 26 and may form a right angle with the platform 26 at which the die 18 is receivable. Further, an alignment edge 28 of the flange 27 at right angles to the platform 26 preferably extends according to a desired planar orientation of the die 18 such that the die 18 is in the desired planar orientation when the side of the die 18 is aligned with the alignment edge 28. Thus, the alignment edge 28 of the collet 12 together with the platform 26 allow the die 18 to be both orientated and sheared as required in preparation for picking up by the collet 12.

FIGS. 3 to 9 illustrate a pick-up process for detaching and picking up a die 18 mounted on an adhesive surface 22 using the collet 12 as shown in FIG. 2. The wafer tray 17 comprises an adhesive surface 22 mounted with at least one die 18 and it is secured in position on the ring holder 20. FIG. 3A illustrates a top view of the collet 12 positioned over the die 18 to be picked up. There may be an angle of misalignment 32 between the alignment edge 28 of the collet 12 and an edge of the die 18. The die 18 has a planar surface 19 which is held against the platform 26 of the collet 12 during die pick-up.

Figure 3A:
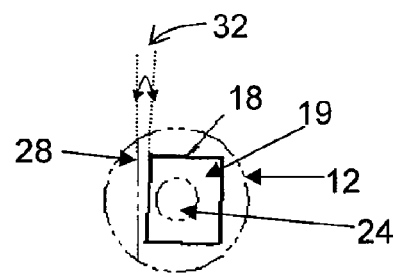
FIGS. 3 to 9 illustrate a pick-up process for detaching and picking up a die from an adhesive surface using the collet as shown in FIG. 2.
Figure 3B:
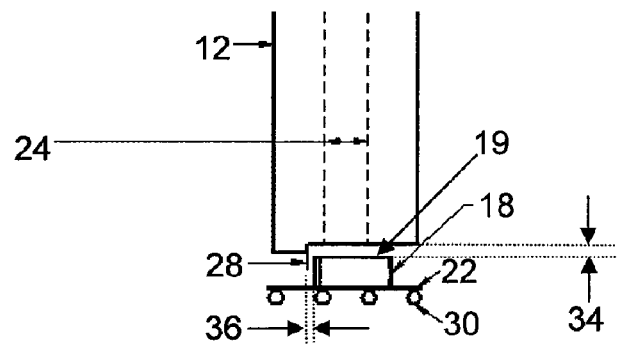

FIG. 3B shows a side view of the collet 12 located over the die 18 held on the adhesive surface 22. The adhesive surface 22 may comprise an adhesive gel membrane and a mesh 30 located adjacent to the membrane for supporting the die 18 on the wafer tray 17. The collet 12 searches down towards the upper surface of the die 18 such that the platform 26 forms a vertical gap 34 with the planar surface 19 of the die 18. This search down process is in two steps (namely first contacting the planar surface of the die 18 with the platform 26 and then separating the platform 26 from the die 18 by raising the collet 12 by a small distance to form the vertical gap 34) to avoid displacing the die 18 held on the adhesive surface 22. At the same time, the side of the die 18 forms a horizontal gap 36 with the alignment edge 28 of the collet 12 by moving the flange of the collet 12 towards the die 18.

Figure 4A:
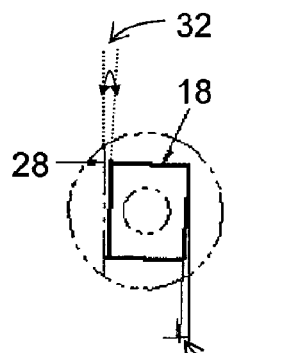
Figure 4B:
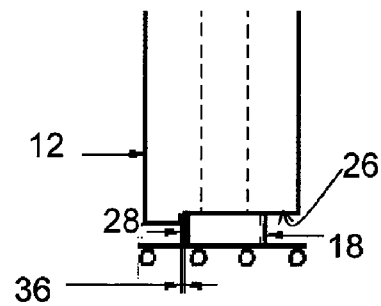

FIG. 4A shows that the angle of misalignment 32 may be reduced as the orientation of the die 18 is corrected. The collet 12 is lowered further to close the vertical gap 34 until the platform 26 of the collet 12 is in contact with the planar surface of the die 18 as illustrated in FIG. 4B. The horizontal gap 36 is reduced when the flange of the collet 12 pushes a side of the die 18 which is substantially perpendicular to the planar surface 19 of the die 18 so that the die 18 is biased to move horizontally in a first direction by the alignment edge 28 of the collet 12. This can be achieved when the die pick arm table 14 drives the collet 12 along the x-axis towards the relatively stationary wafer table 16 to abut and push against the side of the die 18, or when the wafer table 16 moves the die 18 along the x-axis relative to the relatively stationary die pick arm table 14. As a result, the die 18 is rotated on the x-y plane through an angle 33 against the alignment edge 28 of the collet 12. This relative sideways pushing motion of the die 18 with the alignment edge 28 of the collet 12 generates shearing or peeling of the die 18 against the adhesion force from the adhesive surface 22. No vacuum suction is applied on the adhesive surface 22 at this stage, hence the adhesive surface 22 is not deformed.

Figure 5A:
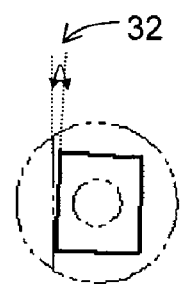
Figure 5B:
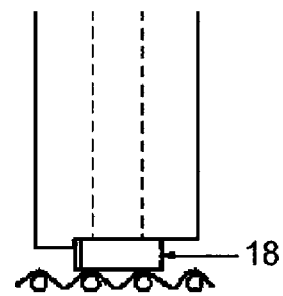

FIG. 5A shows the gap 32 between the alignment edge 28 of the collet 12 and the die 18 remains largely the same as in FIG. 4A. FIG. 5B shows vacuum suction being applied on the adhesive surface 22 such that the gel membrane sinks and the adhesive surface 22 conforms with the upper surface of the mesh 30. The area of contact between the adhesive surface 22 and the die 18 is reduced resulting in a weaker adhesive force on the die 18. The die 18 may also shift downwards due to sinking of the gel. Hence, the collet 12 may move down slightly to maintain contact with the die 18.

Figure 6A:
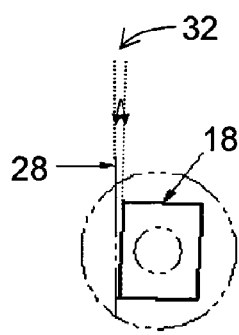

FIG. 6A illustrates the angle of misalignment 32 may still remain the same as that shown in FIG. 5A during the next process step. In FIG. 6B, the collet 12 moves upwards away from the die 18 forming a vertical gap 34 again between the platform 26 of the collet 12 and the planar surface of the die 18. Then, the collet 12 is moved in the direction of the die 18 by moving the die pick arm table 14 along the x-axis relative to the stationary wafer table 16 such that the alignment edge 28 of the collet 12 is brought closer to the die 18 which closes the horizontal gap 36. Alternatively, the wafer table 16 may move the die 18 along the x-axis relative to the stationary die pick arm table 14 to close the horizontal gap 36. This shearing motion on the die 18 helps to further detach the die 18 from the adhesive surface 22.

Figure 6C:
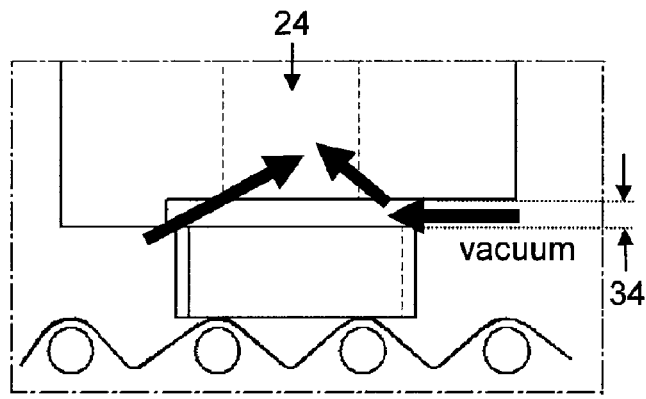
Figure 6B:
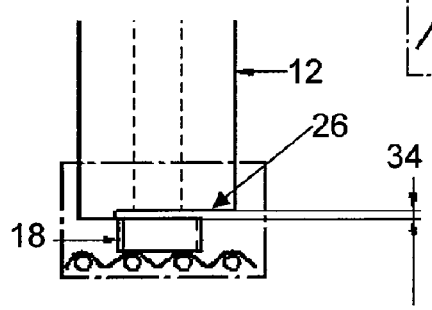

Vacuum suction is applied through the suction channel 24 of the collet 12, which lightly holds the die 18 due to the presence of the vertical gap 34 as illustrated in FIG. 6C. The vacuum suction acting on the planar surface of the die 18 holds the die 18 in position when the alignment edge 28 of the collet 12 pushes the side of the die 18, thereby preventing the die 18 from turning over.

Figure 7A:
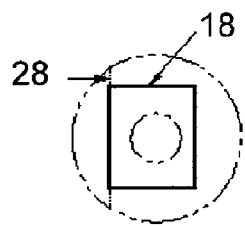
Figure 7B:
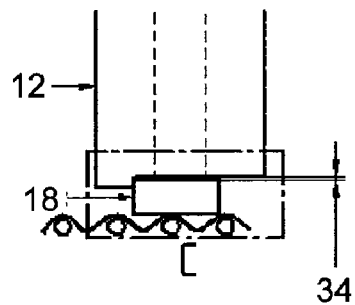
Figure 7C:
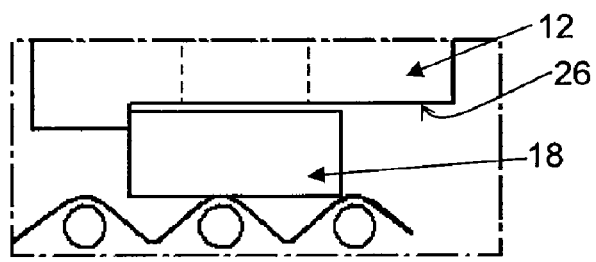

Upon further relative motion in the x-axis, the die 18 is sufficiently rotated on the x-y plane such the side of the die 18 is aligned to the alignment edge 28 of the collet 12 as shown in FIG. 7A to achieve its desired planar orientation. The die 18 is now partially or completely sheared off from the adhesive surface 22. The vertical gap 34 remains between the planar surface of the die 18 and the platform 26 of the collet 12 as in FIGS. 7B and 7C such that the die 18 is weakly held by the vacuum suction from the collet 12.

Figure 8A:
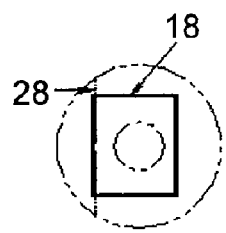
Figure 8B:
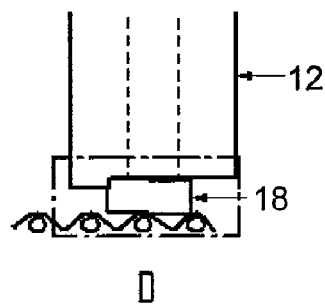
Figure 8C:
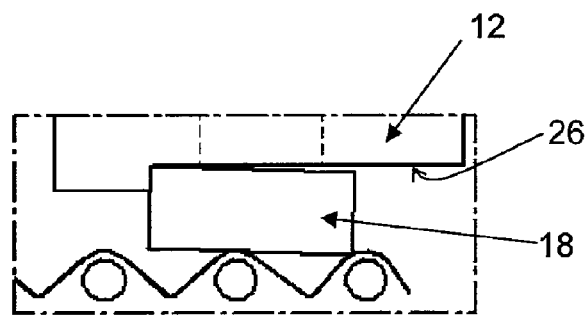

FIG. 8A shows the die 18 aligned with the alignment edge 28 of the collet 12. In FIGS. 8B and 8C, the die 18 is almost completely detached from the adhesive surface 22 and its position is held by the collet 12 by vacuum suction from the suction channel 24 of the collet 12. FIG. 8C shows that the vertical gap 34 is closed considerably and the die 18 is almost completely in contact with the platform 26 of the collet 12.

Figure 9A:
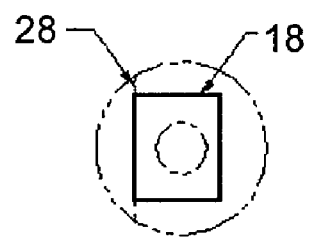
Figure 9B:
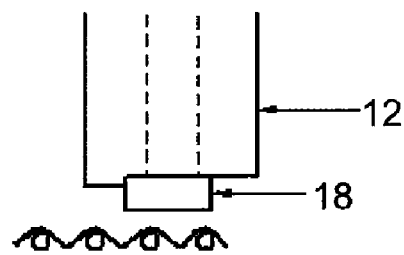

FIG. 9A shows that the die 18 remains aligned with the alignment edge 28 of the collet 12 during pick-up of the die 18. FIG. 9B shows the planar surface of the die 18 is held against the platform 26. The die 18 is being picked up vertically in a second direction substantially perpendicular to the first or horizontal direction by the collet 12 and completely detached from the adhesive surface 22. The collet 12 moves upwards slowly while holding the die 18 to detach the die 18 from the adhesive surface 22 by vacuum suction applied through the collet 12. The slow upward movement when picking the die 18 may comprise lifting the collet 12 stepwise vertically with a time delay between lifting steps to allow the die 18 to be gently peeled off from the adhesive surface 22 while the die 18 remains aligned with the alignment edge 28 of the collet 12.

It should be appreciated that the preferred embodiment of the invention described above provides a method of detaching semiconductor dice 18 from an adhesive surface without the need for manual tools such as tweezers. The alignment edge 28 of the collet 12 provides a flanged surface to push against a side of the die 18 for pre-peeling the die 18 off the adhesive surface 22 with a shearing force. This shearing method of detaching the die 18 saves time and is more effective than the conventional ways of detaching the die 18 which apply solely vacuum force on the die 18 without pre-peeling. There is also a reduced risk of damage to the dice 18 since manual handling of the dice 18 is not required.

The invention described herein is susceptible to variations, modifications and/or additions other than those specifically described and it is to be understood that the invention includes all such variations, modifications and/or additions which fall within the spirit and scope of the above description.

The invention claimed is:

1. A method for picking up a die mounted on an adhesive surface, the method comprising the steps of:
    positioning a collet over the die to be picked up from a wafer tray, the collet comprising:
    a vacuum channel configured to apply a vacuum suction force;
    a flat platform at an end of the collet, the flat platform having a single opening, the single opening being connected to the vacuum channel, and the single opening being configured to apply the vacuum suction force onto a planar surface of the die to hold the die during pick-up of the die from the wafer tray; and
    a single flange protruding from one side of the platform and configured to push against a side of the die which is substantially perpendicular to the planar surface of the die during the pick-up of the die from the wafer tray,
    wherein the platform has a flat surface extending between the single opening and the single flange;
    pushing the side of the die with the flange in a first direction such that the die is biased to move in the first direction by the flange;
    generating a vacuum suction force on the planar surface of the die to hold the planar surface of the die against the platform; and thereafter
    picking up the die with the collet along a second direction which is substantially perpendicular to the first direction,
    wherein the platform forms a gap with the planar surface of the die when the flange is pushing the side of the die.

2. The method as claimed in claim 1, wherein the step of forming the gap between the platform and the planar surface of the die comprises the steps of:
    first contacting the planar surface of the die with the platform, and then
    separating the platform from the planar surface to form the gap.

3. The method as claimed in claim 1, wherein the step of pushing the side of the die with the flange comprises the step of moving the die towards and against the flange.

4. The method as claimed in claim 1, wherein the step of pushing the side of the die with the flange generates shearing or peeling of the die from the adhesive surface.

5. The method as claimed in claim 1, including the step of generating a vacuum suction force on the planar surface of the die when pushing the side of the die with the flange to prevent the die from turning over.

6. The method as claimed in claim 1, wherein an edge of the flange is aligned to a desired planar orientation of the die, and the side of the die is rotated when the die is pushed until the side of the die is aligned with the edge.

7. A method for picking up a die mounted on an adhesive surface, the method comprising the steps of:
    positioning a collet over the die to be picked up from a wafer tray, the collet comprising:
    a vacuum channel configured to apply a vacuum suction force;
    a flat platform at an end of the collet, the flat platform having a single opening, the single opening being connected to the vacuum channel, and the single opening being configured to apply the vacuum suction force onto a planar surface of the die to hold the die during pick-up of the die from the wafer tray; and
    a single flange protruding from one side of the platform and configured to push against a side of the die which is substantially perpendicular to the planar surface of the die during the pick-up of the die from the wafer tray,
    wherein the platform has a flat surface extending between the single opening and the single flange;
    pushing the side of the die with the flange in a first direction such that the die is biased to move in the first direction by the flange;
    generating a vacuum suction force on the planar surface of the die to hold the planar surface of the die against the platform; and thereafter
    picking up the die with the collet along a second direction which is substantially perpendicular to the first direction,
    wherein the step of picking up the die in the second direction further comprises lifting the collet stepwise in the second direction with a time delay between lifting steps to allow the die to be gently peeled off the adhesive surface.

8. The method as claimed in claim 1, wherein the die is mounted on an adhesive surface comprising an adhesive gel membrane.

9. The method as claimed in claim 8, wherein the adhesive surface further comprises a mesh located adjacent to the gel membrane for supporting the die.

* * * * *